United States Patent
Jin et al.

(10) Patent No.: US 9,184,122 B2
(45) Date of Patent: Nov. 10, 2015

(54) INTEGRATED CIRCUIT PACKAGING SYSTEM WITH INTERPOSER AND METHOD OF MANUFACTURE THEREOF

(75) Inventors: Wei Qiang Jin, Shanghai (CN); Ding Hui Xu, Shanghai (CN)

(73) Assignee: STATS ChipPAC Ltd., Singapore (SG)

( * ) Notice: Subject to any disclaimer, the term of this patent is extended or adjusted under 35 U.S.C. 154(b) by 154 days.

(21) Appl. No.: 13/489,850

(22) Filed: Jun. 6, 2012

(65) Prior Publication Data
US 2013/0328216 A1  Dec. 12, 2013

(51) Int. Cl.
| | |
|---|---|
| *H01L 23/498* | (2006.01) |
| *H01L 25/10* | (2006.01) |
| *H01L 23/50* | (2006.01) |
| *H01L 23/31* | (2006.01) |
| *H01L 23/00* | (2006.01) |

(52) U.S. Cl.
CPC ........ *H01L 23/49811* (2013.01); *H01L 25/105* (2013.01); *H01L 23/3121* (2013.01); *H01L 23/49838* (2013.01); *H01L 23/50* (2013.01); *H01L 24/32* (2013.01); *H01L 2224/32145* (2013.01); *H01L 2224/32225* (2013.01); *H01L 2224/33181* (2013.01); *H01L 2224/48145* (2013.01); *H01L 2224/48227* (2013.01)

(58) Field of Classification Search
CPC .................. H01L 25/0657; H01L 2924/01079
USPC ............ 257/777, E21.511, E23.068; 438/126
See application file for complete search history.

(56) References Cited

U.S. PATENT DOCUMENTS

| | | | |
|---|---|---|---|
| 6,077,724 A | 6/2000 | Chen | |
| 7,245,007 B1 | 7/2007 | Foster | |
| 2003/0127723 A1 | 7/2003 | Worz et al. | |
| 2003/0164541 A1* | 9/2003 | Lee | 257/686 |
| 2010/0244024 A1* | 9/2010 | Do et al. | 257/48 |
| 2010/0289128 A1 | 11/2010 | Camacho et al. | |

* cited by examiner

*Primary Examiner* — Edward Wojciechowicz
(74) *Attorney, Agent, or Firm* — Ishimaru & Associates LLP

(57) ABSTRACT

A method of manufacture of an integrated circuit packaging system includes: providing an interposer having an interposer bottom side and an interposer top side; attaching a base integrated circuit to the interposer bottom side; attaching a lead to the interposer bottom side, the lead adjacent the base integrated circuit and entirely below the interposer; and forming an encapsulation partially covering the lead and exposing the interposer top side.

20 Claims, 6 Drawing Sheets

US 9,184,122 B2

INTEGRATED CIRCUIT PACKAGING SYSTEM WITH INTERPOSER AND METHOD OF MANUFACTURE THEREOF

TECHNICAL FIELD

The present invention relates generally to an integrated circuit packaging system, and more particularly to a system for an integrated circuit packaging system with interposer.

BACKGROUND ART

Greater packaging density of integrated circuits ("ICs"), higher performance, and lower cost are ongoing goals of the computer industry. Semiconductor package structures continue to advance toward increasing density of components that are packaged therein. This is in response to continually increasing demands on information and communication products for ever-reduced sizes, thicknesses, and costs, along with ever-increasing performance.

These increasing requirements for density are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability.

Consumer electronics requirements demand more integrated circuits in an integrated circuit package for the increased integrated circuits content. Some technologies primarily focus on integrating more functions into each integrated circuit. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an interposer having an interposer bottom side and an interposer top side; attaching a base integrated circuit to the interposer bottom side; attaching a lead to the interposer bottom side, the lead adjacent the base integrated circuit and entirely below the interposer; and forming an encapsulation partially covering the lead and exposing the interposer top side.

The present invention provides an integrated circuit packaging system, including: an interposer having an interposer bottom side and an interposer top side; a base integrated circuit attached to the interposer bottom side; a lead attached to the interposer bottom side, adjacent the base integrated circuit, and entirely below the interposer; and an encapsulation partially covering the lead and exposing the interposer top side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
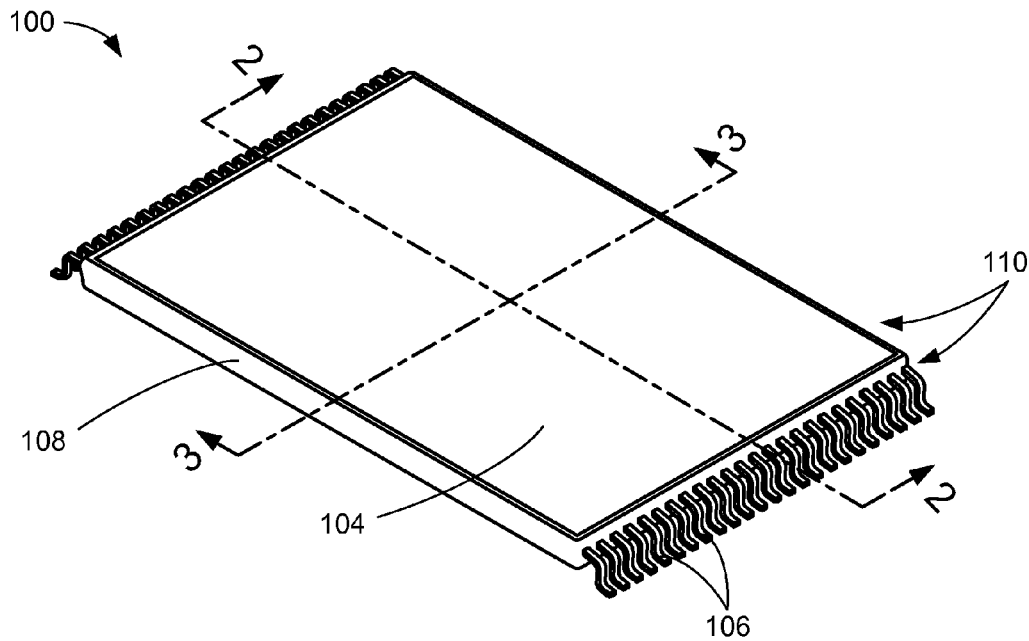
FIG. 1 is a top isometric view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct physical contact between one element and another element without an intervening element.

The term "processing" as used herein includes deposition of material or photoresist, patterning, exposure, development, etching, cleaning, and/or removal of the material or photoresist as required in forming a described structure.

Referring now to FIG. 1, therein is shown a top isometric view of an integrated circuit packaging system 100 in a first embodiment of the present invention. The integrated circuit packaging system 100 can include a thin small outline package (TSOP).

The integrated circuit packaging system 100 can include an integrated circuit packaging system 100. The integrated circuit packaging system 100 can include an interposer 104, which is defined as a support structure for mounting and connecting a circuit device thereto including providing electrical connections through the support structure. The interposer 104 can serve as a die attach paddle.

The interposer 104 can provide an interposer warpage control in an approximate range of 0.5% to 0.8% of a thickness of the interposer 104. The interposer warpage control is based on a percentage of the thickness of the interposer 104. For example, the interposer 104 can represent a support structure including a laminate substrate, a ceramic substrate, bismaleimide triazine (BT), resin core material, or copper clad laminates (CCL).

The integrated circuit packaging system 100 can include leads 106, which are defined as electrically conductive connectors. The integrated circuit packaging system 100 can include an encapsulation 108, which is defined as a package cover of a semiconductor package to hermetically seal a circuit device as well as providing mechanical and environmental protection. For example, the encapsulation 108 can represent a package body.

The interposer 104 and the leads 106 can be partially exposed from the encapsulation 108. The leads 106 can protrude from the encapsulation 108. The leads 106 can be entirely below the interposer 104. The leads 106 can protrude at encapsulation peripheral sides 110 of the encapsulation 108. As a specific example, the leads 106 can protrude at only two of the encapsulation peripheral sides 110.

It has been discovered that the interposer 104 provides improved reliability since warpage of the interposer 104 is reduced with the interposer warpage control in an approximate range of 0.5% to 0.8%.

Figure 2:
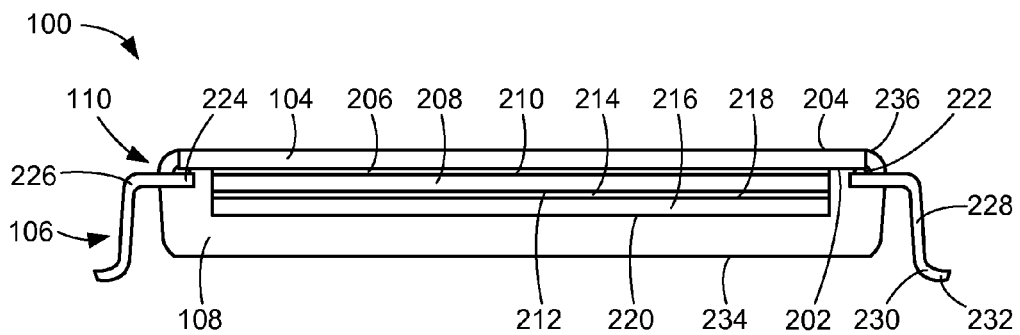
FIG. 2 is a cross-sectional view of the integrated circuit packaging system taken along line 2-2 of FIG. 1.

Referring now to FIG. 2, therein is shown a cross-sectional view of the integrated circuit packaging system 100 taken along line 2-2 of FIG. 1. The cross-sectional view depicts the integrated circuit packaging system 100 having the interposer 104 with an interposer bottom side 202 and an interposer top side 204. The integrated circuit packaging system 100 can include a base attach layer 206 for mounting a base integrated circuit 208 under the interposer 104. The base integrated circuit 208 can include a base inactive side 210 and a base active side 212. The base attach layer 206 can be attached to the base inactive side 210 and the interposer bottom side 202.

The base integrated circuit 208 is defined as a circuit device having a number of integrated transistors interconnected to form active circuits. The base active side 212 is defined as a side of the base integrated circuit 208 having active circuitry fabricated thereon or having elements for connection to the active circuitry of the base integrated circuit 208. For example, the base integrated circuit 208 can represent a circuit device including an integrated circuit die, a wirebond integrated circuit, or a flip-chip.

The integrated circuit packaging system 100 can include a stack attach layer 214 for mounting a stack integrated circuit 216 under the base integrated circuit 208. The stack integrated circuit 216 overhangs the base integrated circuit 208. The stack integrated circuit 216 can include a stack inactive side 218 and a stack active side 220. The stack attach layer 214 can be attached to the stack inactive side 218 and the base active side 212.

The stack integrated circuit 216 is defined as a circuit device having a number of integrated transistors interconnected to form active circuits. The stack active side 220 is defined as a side of the stack integrated circuit 216 having active circuitry fabricated thereon or having elements for connection to the active circuitry of the stack integrated circuit 216. For example, the stack integrated circuit 216 can represent a circuit device including an integrated circuit die, a wirebond integrated circuit, or a flip-chip.

The integrated circuit packaging system 100 can include a lead attach layer 222 for mounting and electrically connecting each of the leads 106 to the interposer 104. The lead attach layer 222 can be attached to a portion of each of the leads 106 to a portion of the interposer bottom side 202. The lead attach layer 222 can be attached to an end of each of the leads 106 and an end of the interposer 104. For example, the lead attach layer 222 can be a structure having an attachment material including an adhesive, an epoxy, and a thermally or electrically conductive material.

Each of the leads 106 can include a single integral structure having a lead inner portion 224, a lead top bent 226, a lead connecting portion 228, a lead bottom bent 230, and a lead outer portion 232. The single integral structure is preferably contiguous and formed of a common material. The lead top bent 226 can be connected to the lead inner portion 224 and the lead connecting portion 228. The lead top bent 226 can be formed to provide the lead inner portion 224 at an obtuse angle to the lead connecting portion 228.

The lead bottom bent 230 can be connected to the lead connecting portion 228 and the lead outer portion 232. The lead bottom bent 230 can be formed to provide the lead outer portion 232 at an obtuse angle to the lead connecting portion 228. For example, each of the lead top bent 226 and the lead top bent 226 can include a curve shape.

The lead attach layer 222 can be attached to an upper surface of the lead inner portion 224. The lead inner portion 224 and the lead top bent 226 can be closer to the interposer 104 than the lead connecting portion 228, the lead bottom bent 230, and the lead outer portion 232. The lead connecting portion 228 can downwardly extend from the lead top bent 226 to the lead bottom bent 230. The lead outer portion 232 can extend from the lead bottom bent 230 and away from the encapsulation peripheral sides 110.

With a combination of the lead attach layer 222 attached to the lead inner portion 224 and the lead connecting portion 228 downwardly extending away from the interposer 104, the leads 106 can provide sufficient standoff gap for mounting the base integrated circuit 208 and the stack integrated circuit 216. For example, the standoff gap can provide more die stack spacing to accommodate a quad-die package (QDP) structure.

The stack integrated circuit 216 can be vertically between the lead inner portion 224 and the lead outer portion 232. The stack active side 220 can be below the lead inner portion 224 and above the lead outer portion 232.

The encapsulation 108 can be formed to cover the interposer 104, the base attach layer 206, the base integrated circuit 208, the stack attach layer 214, the stack integrated circuit 216, the lead attach layer 222, and the lead inner portion 224 of each of the leads 106. The lead outer portion 232 can extend below an encapsulation bottom surface 234 of the encapsulation 108. The interposer top side 204 can be exposed from the encapsulation 108 and coplanar with an encapsulation top surface 236 of the encapsulation 108.

It has been discovered that the lead inner portion 224 attached to the interposer bottom side 202 provides reduced package height profile because the leads 106 provide standoff area or spacing under the interposer 104 for attaching the base integrated circuit 208 and the stack integrated circuit 216 to the interposer 104.

It has also been discovered that the interposer top side 204 exposed from the encapsulation 108 and coplanar with the encapsulation top surface 236 provides improved reliability. Since the encapsulation 108 is formed below the interposer 104, there is no top and bottom mold imbalance, which is a problem in current thin small outline package stacked die version (TSOP-SDx) packages. With sufficient spacing between the stack integrated circuit 216 and the encapsulation bottom surface 234, there is no issue with minimum gap requirements and thus no mold voids in the encapsulation 108 thereby providing improved reliability.

It has further been discovered that the interposer top side 204 exposed from the encapsulation 108 provides reduced package height profile as well as improved integration because the leads 106 provide increased standoff area under the interposer 104 for accommodating spacing for more die stacks. The increased standoff area provides quad-die package (QDP) structures with approximately 1-millimeter (mm) package thickness. Chip-on-lead (COL) packages do not have exposed die-attach paddle (EDP) and thus do not have spacing to accommodate more die stacks. Further, the interposer top side 204 exposed from the encapsulation 108 provides thicker die support without back grinding processes.

Figure 3:
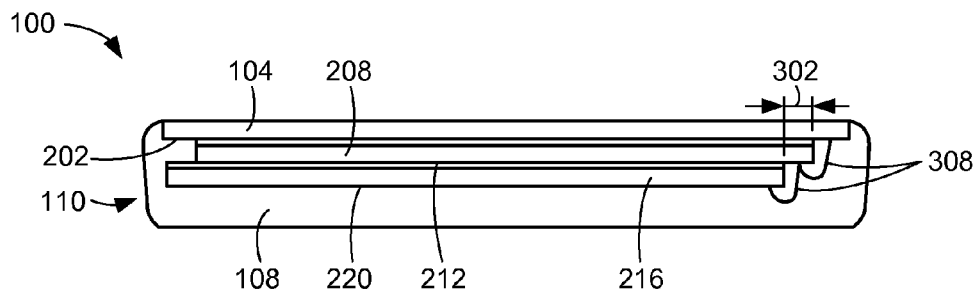
FIG. 3 is a cross-sectional view of the integrated circuit packaging system taken along line 3-3 of FIG. 1.

Referring now to FIG. 3, therein is shown a cross-sectional view of the integrated circuit packaging system 100 taken along line 3-3 of FIG. 1. The cross-sectional view depicts the integrated circuit packaging system 100 having the stack integrated circuit 216 mounted at an inter-device offset 302 horizontally away from the base integrated circuit 208. The inter-device offset 302 is defined as a distance from a non-horizontal side of the stack integrated circuit 216 to a non-horizontal side of the base integrated circuit 208.

The integrated circuit packaging system 100 can include internal connectors 308, which are defined as electrically conductive connectors. Examples of the internal connectors 308 are bond wires, ribbon bond wires, or conductive brackets. A first of the internal connectors 308 can be attached to the interposer bottom side 202 and the base active side 212. A second of the internal connectors 308 can be attached directly to the base active side 212 and the stack active side 220. The first of the internal connectors 308 and the second of the internal connectors 308 can be electrically connected together.

The internal connectors 308 can be attached to an end of the interposer 104 and an end of the base integrated circuit 208. As a specific example, the first of the internal connectors 308 can be attached to only one end of the interposer 104 and only one end of the base integrated circuit 208. As a specific example, the second of the internal connectors 308 can be attached to only one end of the base integrated circuit 208 and only one end of the stack integrated circuit 216.

The internal connectors 308 can be adjacent one of the encapsulation peripheral sides 110 of the encapsulation 108. As a specific example, the first of the internal connectors 308 and the second of the internal connectors 308 can be adjacent only one of the encapsulation peripheral sides 110 of the encapsulation 108. The first of the internal connectors 308 and the second of the internal connectors 308 can be covered by the encapsulation 108.

It has been discovered that the stack integrated circuit 216 mounted at the inter-device offset 302 horizontally away from the base integrated circuit 208 provides improved reliability since the internal connectors 308 are able to be attached to the interposer bottom side 202, the base active side 212, and the stack active side 220. The internal connectors 308 are able to be attached with reduced wire lengths thereby eliminating wire shorts resulting in improved reliability.

Figure 4:
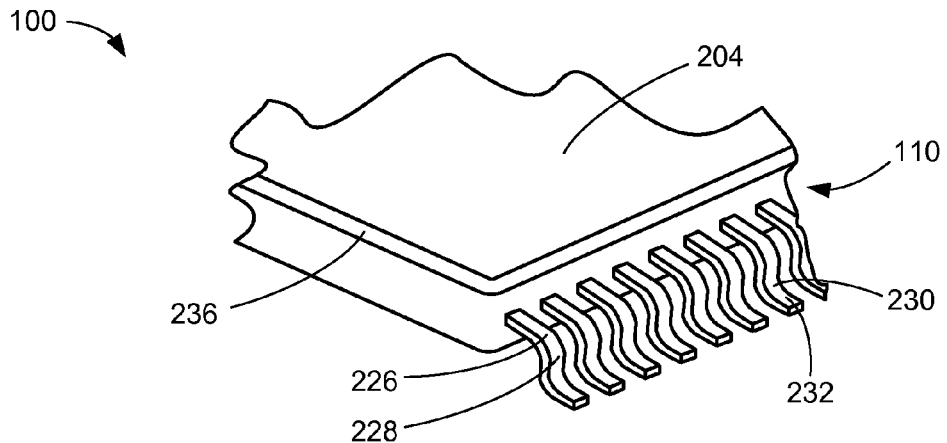
FIG. 4 is a top isometric view of a portion of the integrated circuit packaging system.

Referring now to FIG. 4, therein is shown a top isometric view of a portion of the integrated circuit packaging system 100. The interposer top side 204 can be exposed from the encapsulation top surface 236.

The lead top bent 226 can be connected to the lead inner portion 224 of FIG. 2 and the lead connecting portion 228. The lead bottom bent 230 can be connected to the lead connecting portion 228 and the lead outer portion 232.

The lead connecting portion 228 can downwardly extend from the lead top bent 226 to the lead bottom bent 230. The lead outer portion 232 can extend from the lead bottom bent 230 and away from the encapsulation peripheral sides 110.

Figure 5:
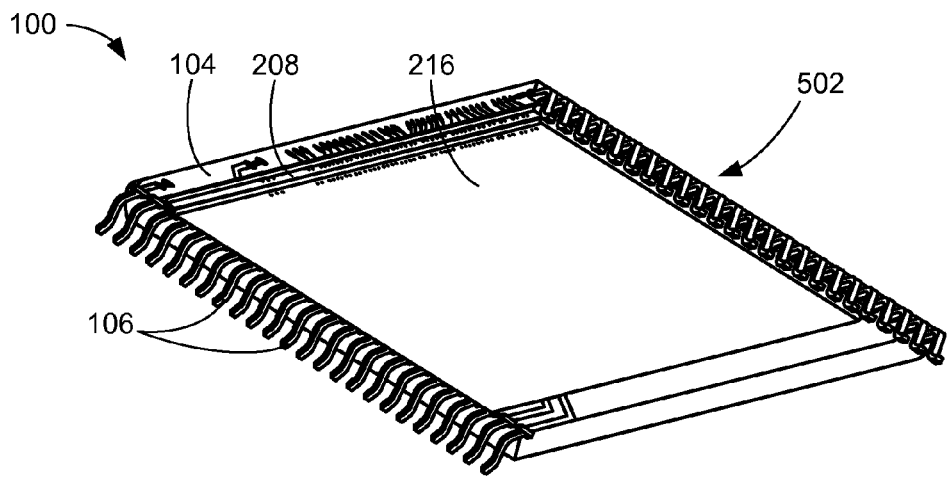
FIG. 5 is a bottom isometric view of the integrated circuit packaging system.

Referring now to FIG. 5, therein is shown a bottom isometric view of the integrated circuit packaging system 100. The bottom isometric view depicts without the encapsulation 108 of FIG. 1 and the internal connectors 308 of FIG. 3. The bottom isometric view depicts the compound (CPD) or molding compound body as transparent.

The integrated circuit packaging system 100 can include the stack integrated circuit 216 attached to the base integrated circuit 208 under the interposer 104. The integrated circuit packaging system 100 can include the leads 106 attached to the interposer 104. The leads 106 can be along interposer peripheral sides 502 of the interposer 104. As a specific example, the leads 106 can be along only two interposer peripheral sides 502 of the interposer 104.

Figure 6:
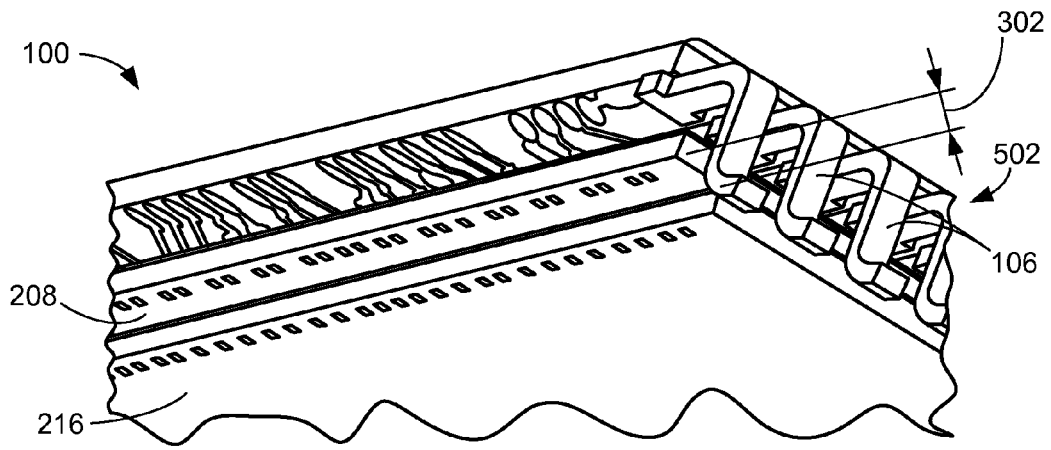
FIG. 6 is a bottom isometric view of a portion of the integrated circuit packaging system.

Referring now to FIG. 6, therein is shown a bottom isometric view of a portion of the integrated circuit packaging system 100. The bottom isometric view depicts the stack integrated circuit 216 attached at the inter-device offset 302 from the base integrated circuit 208. The leads 106 can be attached to one of the interposer peripheral sides 502.

Figure 7:
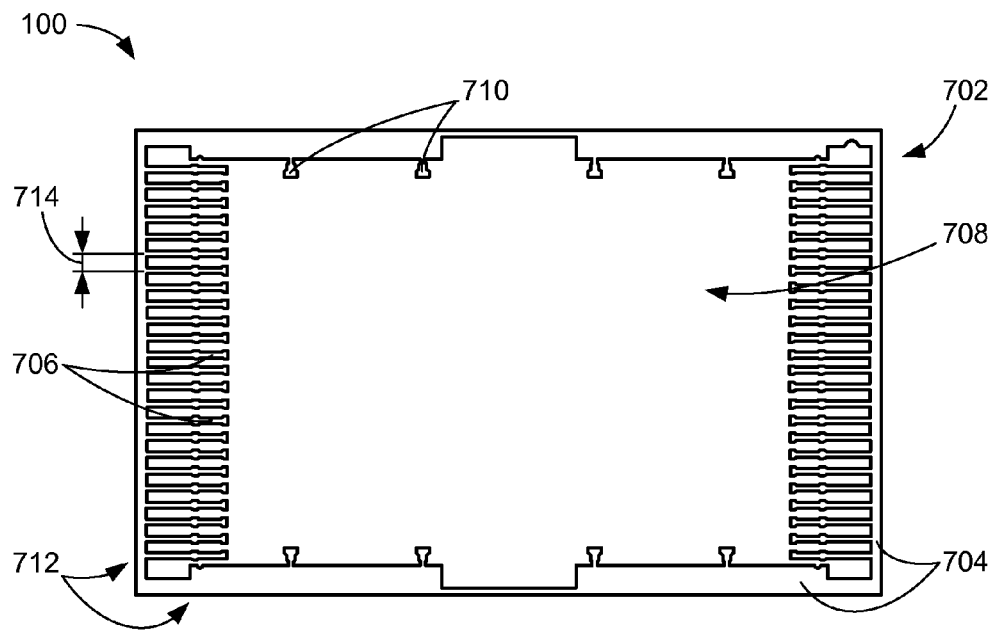
FIG. 7 is a top view of a leadframe of the integrated circuit packaging system.

Referring now to FIG. 7, therein is shown a top view of a leadframe 702 of the integrated circuit packaging system 100. The leadframe 702 is defined as a structure having dam bars 704 that hold lead segments 706 together. The leadframe 702 can be provided with the dam bars 704 not trimmed. The lead segments 706 are structures that are used to form the leads 106 of FIG. 1 using a singulation process in a subsequent phase of manufacture.

The leadframe 702 can include an opening 708 surrounded by the dam bars 704 and the lead segments 706. The leadframe 702 having the opening 708 does not include a die attach paddle. Instead, the interposer 104 of FIG. 1 can provide a function of a die attach paddle for mounting the base integrated circuit 208 of FIG. 2 and the stack integrated circuit 216 of FIG. 2.

The leadframe 702 having the opening 708 can provide a simplified, hollowed out, and standardized structure, which can be shared with any devices and any wire bonding layout. As such, there is no need to order different lead frame tooling for different devices. Different interconnections can be provided by the interposer 104 with trace routing.

The leadframe 702 can include protrusions 710 for supporting the leadframe 702 when the leadframe 702 is mounted over the interposer 104 in a subsequent phase of manufacturing. The protrusions 710 can extend from two of the dam bars 704 towards the opening 708. The protrusions 710 and the lead segments 706 can be formed at leadframe peripheral sides 712 of the leadframe 702.

As a specific example, the protrusions 710 can be formed at only two of the leadframe peripheral sides 712 that are opposing each other. As another specific example, the lead segments 706 can be formed at only two of the leadframe peripheral sides 712 that are connected to and adjacent the leadframe peripheral sides 712 where the protrusions 710 are formed.

For example, the leadframe 702 can include a thickness of 0.127 millimeters (mm). Also for example, the lead segments 706 can be formed such that the leads 106 can include a lead pitch 714 of 0.5 millimeters (mm). The lead pitch 714 is defined as a distance between geometrical centers of the leads 106 that are adjacent and closest to each other.

It has been discovered that the leadframe 702 with the opening 708 provides a basic, simplified, and standardized structure for packaging systems that are the same or having the same lead counts. For such packaging systems, the leadframe 702 does not have to be redesigned. Instead, a new layout design of the interposer 104 is needed for new device requests resulting in reduced leadframe manufacturing cost.

It has also been discovered that the interposer 104 having the interposer warpage control in an approximate range of 0.5% to 0.8% provides improved reliability by providing reduced warpage for attaching the leadframe 702 to the interposer 104.

It has further been discovered that the leadframe 702 having the lead segments 706 and the opening 708 provides manufacturing cost reduction. Since the lead segments 706 are not routed from one side to another side of the leadframe 702, the lead segments 706 do not have to be long resulting in manufacturing cost reduction. Design of current thin small outline package (TSOP) chip on lead (COL) packages requires inner leads go through the package from one side to another side of the package for suitable wire bonding connection. The inner leads are very long, which is a challenge and cost to both leadframe manufacturing and packaging assembly.

Figure 8:
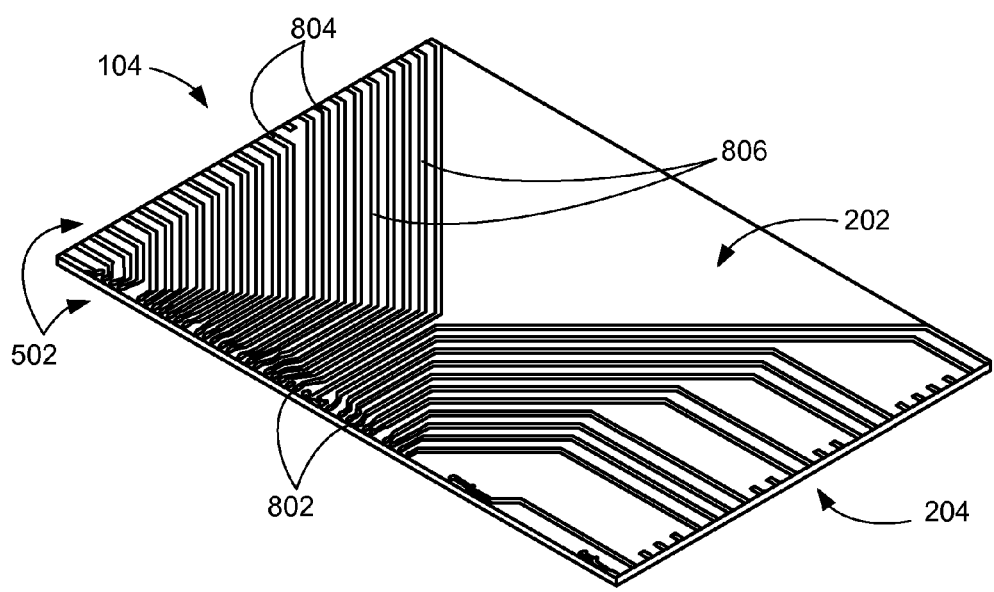
FIG. 8 is a top isometric view of the interposer.

Referring now to FIG. 8, therein is shown a top isometric view of the interposer 104. The top isometric view depicts the interposer bottom side 202 of the interposer 104. The interposer 104 can include interposer fingers 802, interposer pads 804, interposer traces 806, and vias (not shown). The interposer fingers 802, the interposer pads 804, and the interposer traces 806 can be formed as a single integral structure.

The interposer fingers 802 are defined as electrical contacts for attaching the internal connectors 308 of FIG. 3. The interposer pads 804 are defined as electrical contacts for attaching the leads 106 of FIG. 1. The interposer traces 806 are defined as electrical connectors for transmission of electrical signals or electrical potential levels between the interposer fingers 802 and the interposer pads 804.

The interposer fingers 802 can be formed adjacent and along one of the interposer peripheral sides 502. As a specific example, the interposer fingers 802 can be formed adjacent and along only one of the interposer peripheral sides 502. The interposer fingers 802 can be formed to satisfy connection requirements of the internal connectors 308 as well as to match locations of contact pads of the base integrated circuit 208 of FIG. 2 and the stack integrated circuit 216 of FIG. 2. As a specific example, the interposer fingers 802 can be formed adjacent and along only a first of the interposer peripheral sides 502.

The interposer pads 804 can be formed adjacent and along two of the interposer peripheral sides 502. As a specific example, the interposer pads 804 can be formed adjacent and along only a second of the interposer peripheral sides 502 and a third of the interposer peripheral sides 502 opposing the second of the interposer peripheral sides 502. The first of the interposer peripheral sides 502 can be between and connected to the second of the interposer peripheral sides 502 and the third of the interposer peripheral sides 502. Also for example, the first of the interposer peripheral sides 502 can have a length less than lengths of the second of the interposer peripheral sides 502 and the third of the interposer peripheral sides 502.

The interposer 104 can include any number of conductive layers including a conductive material such as copper (Cu). The conductive layers can be used to form the interposer fingers 802, the interposer pads 804, and the interposer traces 806. The conductive layers can include traces and vias for transmission of electrical signals between the conductive layers.

For example, the interposer 104 can include a single conductive layer or two conductive layers based on complexity of interconnection between the interposer fingers 802 and the interposer pads 804. Also for example, the interposer fingers 802, the interposer pads 804, and the interposer traces 806 can be formed on the interposer bottom side 202, the interposer top side 204, or a combination thereof.

For example, the interposer 104 can include an approximate size of 17.4 millimeters (mm)×11.7 millimeters (mm). Also for example, the interposer 104 can include a thickness of approximately 0.24 millimeters (mm).

It has been discovered that the interposer 104 having the interposer fingers 802 along only one of the interposer peripheral sides 502 provides improved wire bonding capability since the interposer fingers 802 provide attachment sites for the internal connectors 308 to be attached with reduced wire lengths. The reduced wire lengths eliminate lead short issues resulting in improved wire bonding capability as well as improved product yields.

Figure 9:
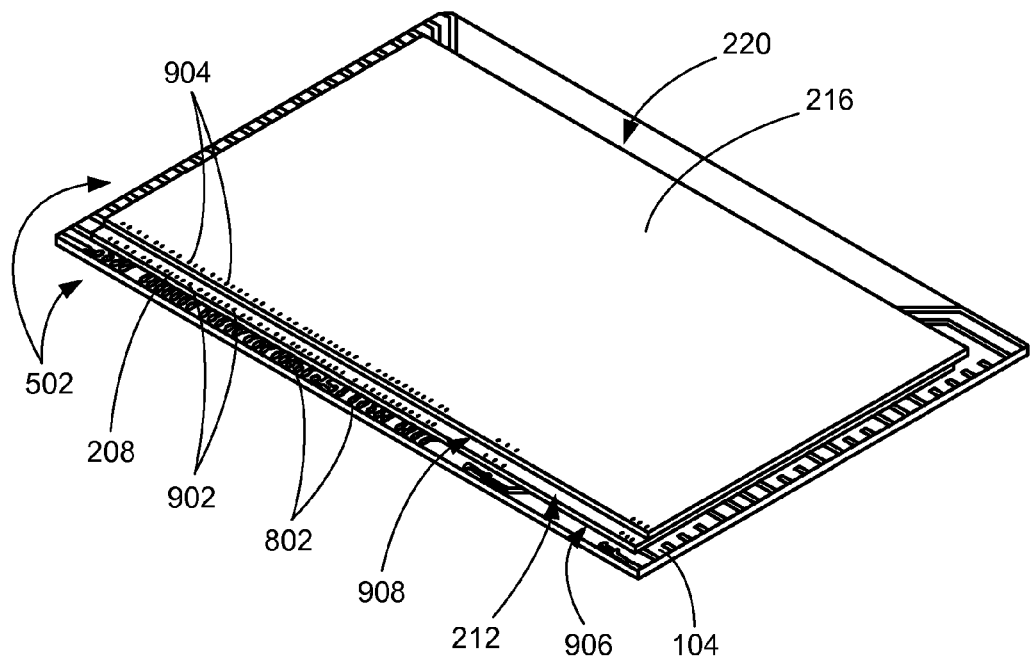
FIG. 9 is the structure of FIG. 8 with the stack integrated circuit over the base integrated circuit.

Referring now to FIG. 9, therein is shown the structure of FIG. 8 with the stack integrated circuit 216 over the base integrated circuit 208. The base integrated circuit 208 can be attached to the interposer 104. The stack integrated circuit 216 can be attached to the base integrated circuit 208.

The base integrated circuit 208 can include base pads 902, which are defined as electrical contacts for attaching the leads 106 of FIG. 1. The stack integrated circuit 216 can include stack pads 904, which are defined as electrical contacts for attaching the leads 106. For example, the base pads 902 and the stack pads 904 can represent attachment structures including die bond pad opening (BPO).

The base pads 902 can be formed adjacent and along one of base peripheral sides 906 of the base integrated circuit 208. As a specific example, the base pads 902 can be formed adjacent and along only one of the base peripheral sides 906 of the base integrated circuit 208. The stack pads 904 can be formed adjacent and along one of stack peripheral sides 908 of the stack integrated circuit 216. As a specific example, the stack pads 904 can be formed adjacent and along only one of the stack peripheral sides 908 of the stack integrated circuit 216.

The base pads 902 and the stack pads 904 can be formed at the base active side 212 and the stack active side 220, respectively. As a specific example, the base integrated circuit 208 and the stack integrated circuit 216 can be mounted such that the base pads 902 and the stack pads 904 are formed along and adjacent only the first of the interposer peripheral sides 502, where the interposer fingers 802 are formed. The internal connectors 308 of FIG. 3 can be attached to the interposer fingers 802, the base pads 902, and the stack pads 904.

It has been discovered that the interposer fingers 802, the base pads 902, and the stack pads 904 formed along and adjacent only the first of the interposer peripheral sides 502 provide improved reliability. Distances between the interposer fingers 802, the base pads 902, and the stack pads 904 are reduced resulting in reduced wire lengths of the internal connectors 308. The reduced wire lengths eliminate lead short issues and wirebond bouncing issues thereby providing improved reliability.

Figure 10:
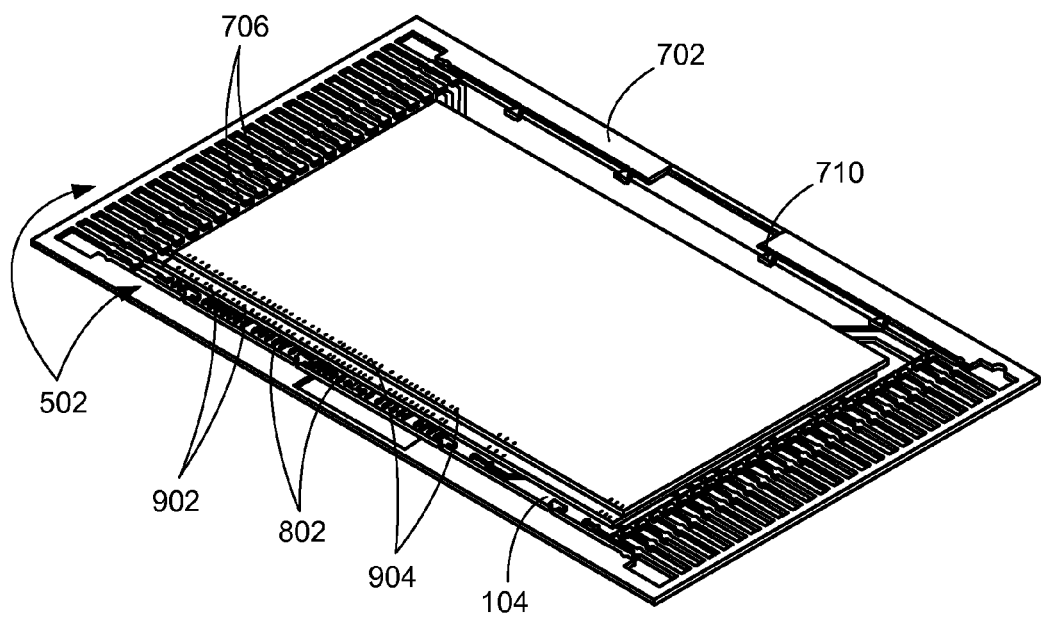
FIG. 10 is the structure of FIG. 9 with the leadframe attached to the interposer.

Referring now to FIG. 10, therein is shown the structure of FIG. 9 with the leadframe 702 attached to the interposer 104. The leadframe 702 can be mounted over or attached to the interposer 104. The lead segments 706 can be attached to the interposer pads 804 of FIG. 8. For example, the leadframe 702 can be mounted using a mounting process including surface mount technology (SMT).

The protrusions 710 can be mounted over or attached to the interposer 104 at two of the interposer peripheral sides 502 opposing each other. The protrusions 710 provide support for mounting the leadframe 702 over the interposer 104.

The first of the internal connectors 308 of FIG. 3 can be attached to one of the interposer fingers 802 and one of the base pads 902. The second of the internal connectors 308 can be attached to one of the base pads 902 and one of the stack pads 904.

In a subsequent phase, the singulation process including cutting and stamping to sever the lead segments 706 to form the leads 106 of FIG. 1. The protrusions 710 can also be removed.

It has been discovered that the interposer 104 having the interposer pads 804 provide improved reliability because the interposer pads 804 provide structural stability for attaching the lead segments 706 even without tape support on the leadframe 702.

Figure 11:
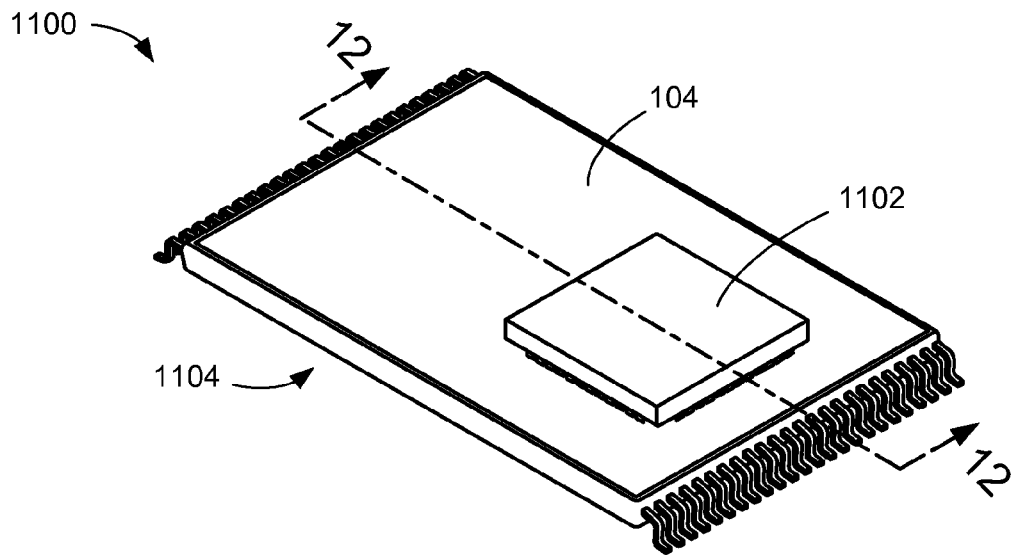
FIG. 11 is a top isometric view of an integrated circuit packaging system in a second embodiment of the present invention.

Referring now to FIG. 11, therein is shown a top isometric view of an integrated circuit packaging system 1100 in a second embodiment of the present invention. The integrated circuit packaging system 1100 can include a package-on-package (PoP) structure. The integrated circuit packaging system 1100 can include a stack package 1102 mounted over a base package 1104. The base package 1104 is similar to the integrated circuit packaging system 100 of FIG. 1, except that the base package 1104 also includes the interposer 104 having contacts (not shown) for attaching the stack package 1102.

The stack package 1102 can be attached to any portion of the interposer 104 of the base package 1104. The stack package 1102 is defined as a semiconductor package. For example, the stack package 1102 can represent a semiconductor package including a quad flat no-lead (QFN) package.

Figure 12:
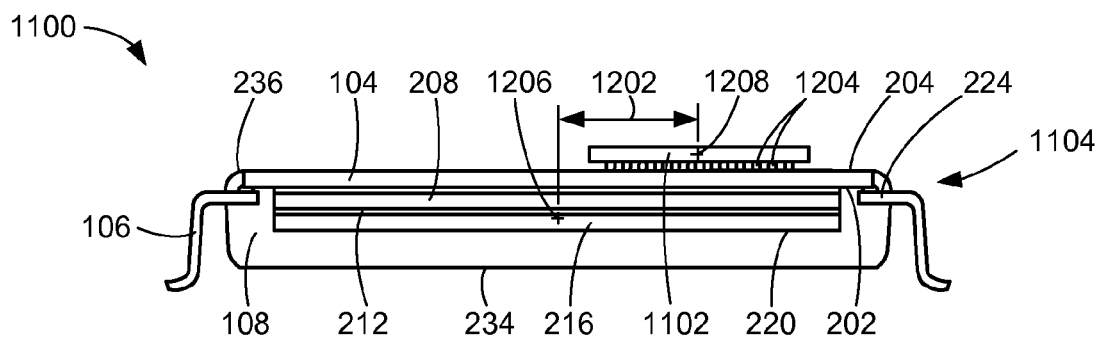
FIG. 12 is a cross-sectional view of the integrated circuit packaging system taken along line 12-12 of FIG. 11.

Referring now to FIG. 12, therein is shown a cross-sectional view of the integrated circuit packaging system 1100 taken along line 12-12 of FIG. 11. The stack package 1102 can be mounted at an inter-package offset 1202 horizontally away from the base package 1104. The stack package 1102 can include stack interconnects 1204 attached to the base package 1104. The stack interconnects 1204 are defined as electrically conductive connectors.

The inter-package offset 1202 is defined as a distance from a base center 1206, shown as a cross, of the base package 1104 and a stack center 1208, shown as a cross, of the stack package 1102. The base center 1206 and the stack center 1208 are geometrical centers of the base package 1104 and the stack package 1102, respectively.

It has been discovered that the interposer 104 provides improved reliability since warpage of the interposer 104 is reduced with the interposer warpage control in an approximate range of 0.5% to 0.8%.

It has also been discovered that the lead inner portion 224 attached to the interposer bottom side 202 provides reduced package height profile because the leads 106 provide standoff area or spacing under the interposer 104 for attaching the base integrated circuit 208 and the stack integrated circuit 216 to the interposer 104.

It has further been discovered that the interposer top side 204 exposed from the encapsulation 108 and coplanar with the encapsulation top surface 236 provides improved reliability. Since the encapsulation 108 is formed only at and below the interposer 104, there is no top and bottom mold imbalance, which is a problem in current thin small outline package stacked die version (TSOP-SDx) packages. With sufficient spacing between the stack integrated circuit 216 and the encapsulation bottom surface 234, there is no issue with minimum gap requirements and thus no mold voids in the encapsulation 108 thereby providing improved reliability.

It has further been discovered that the interposer top side 204 exposed from the encapsulation 108 provides reduced package height profile as well as improved integration because the leads 106 provide increased standoff area under the interposer 104 for accommodating spacing for more die stacks. The increased standoff area provides quad-die package (QDP) structures with approximately 1-millimeter (mm) package thickness. Chip-on-lead (COL) packages do not have exposed die-attach paddle (EDP) and thus do not have spacing to accommodate more die stacks. Further, the interposer top side 204 exposed from the encapsulation 108 provides thicker die support without back grinding processes.

It has further been discovered that the stack integrated circuit 216 mounted at the inter-device offset 302 of FIG. 3 horizontally away from the base integrated circuit 208 provides improved reliability since the internal connectors 308 of FIG. 3 are able to be attached to the interposer bottom side 202, the base active side 212, and the stack active side 220. The internal connectors 308 are able to be attached with reduced wire lengths thereby eliminating wire shorts resulting in improved reliability.

It has further been discovered that the leadframe 702 of FIG. 7 with the opening 708 of FIG. 7 provides a basic, simplified, and standardized structure for packaging systems that are the same or having the same lead counts. For such packaging systems, the leadframe 702 does not have to be redesigned. Instead, a new layout design of the interposer 104 is needed for new device requests resulting in reduced leadframe manufacturing cost.

It has further been discovered that the interposer 104 having the interposer warpage control in an approximate range of 0.5% to 0.8% provides improved reliability by providing reduced warpage for attaching the leadframe 702 to the interposer 104.

It has further been discovered that the interposer 104 having the interposer fingers 802 of FIG. 8 along only one of the interposer peripheral sides 502 of FIG. 5 provides improved wire bonding capability since the interposer fingers 802 provide attachment sites for the internal connectors 308 to be attached with reduced wire lengths. The reduced wire lengths eliminate lead short issues resulting in improved wire bonding capability as well as improved product yields.

It has further been discovered that the interposer fingers 802, the base pads 902 of FIG. 9, and the stack pads 904 of FIG. 9 formed along and adjacent only the first of the interposer peripheral sides 502 provide improved reliability. Distances between the interposer fingers 802, the base pads 902, and the stack pads 904 are reduced resulting in reduced wire lengths of the internal connectors 308. The reduced wire lengths eliminate lead short issues and wirebond bouncing issues thereby providing improved reliability.

It has further been discovered that the interposer 104 having the interposer pads 804 of FIG. 8 provide improved reliability because the interposer pads 804 provide structural stability for attaching the lead segments 706 of FIG. 7 even without tape support on the leadframe 702.

It has further been discovered that the interposer top side 204 exposed from the encapsulation 108 allows the stack package 1102 to be mounted over the base package 1104 thereby providing improved integration.

It has further been discovered that the stack package 1102 mounted at the inter-package offset 1202 from the base package 1104 provides improved system performance as well as improved system level integration. The inter-package offset 1202 allows the stack package 1102 to be closer to the leads 106 resulting in less propagation delays due to shorter connection distance to a system board, the base integrated circuit 208, and the stack integrated circuit 216 thereby providing improved system performance. The inter-package offset 1202 allows additional packages to be mounted over the base package 1104 thereby providing improved system level integration.

Figure 13:
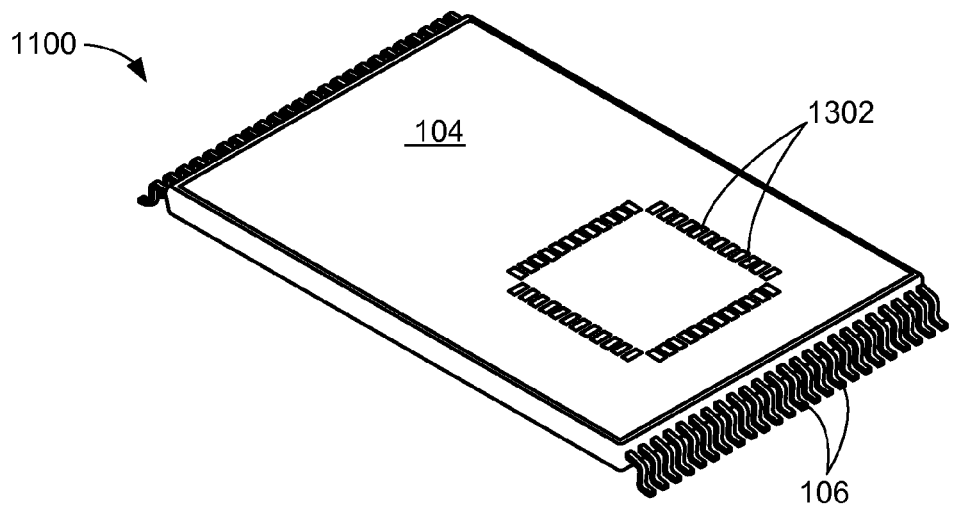
FIG. 13 is a top isometric view of a portion of the integrated circuit packaging system.

Referring now to FIG. 13, therein is shown a top isometric view of a portion of the integrated circuit packaging system 1100. The interposer 104 can include interposer contacts 1302, which as defined as attachment sites providing electrical connectivity for mounting the stack package 1102 of FIG. 11. The stack package 1102 can be attached to the interposer contacts 1302.

The interposer contacts 1302 can be formed in an array of any number of rows. The interposer contacts 1302 can be electrically connected to the interposer traces 806 of FIG. 8 to provide electrical connectivity between the stack package 1102 and the base integrated circuit 208 of FIG. 2, the stack integrated circuit 216 of FIG. 2, the leads 106, or a combination thereof.

Figure 14:
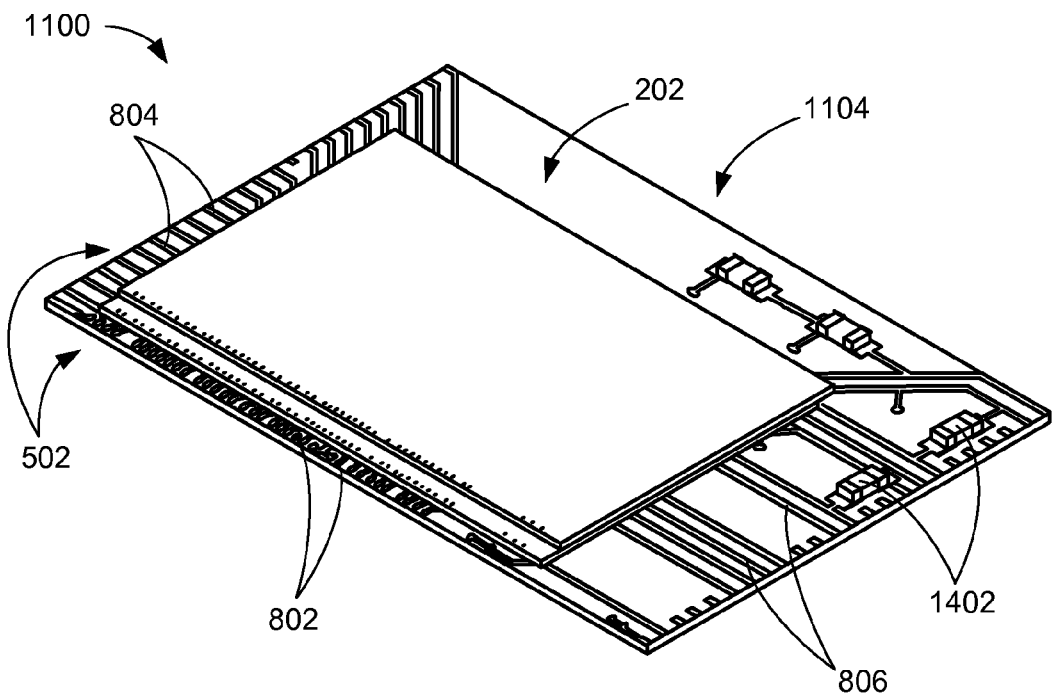
FIG. 14 is a bottom isometric view of a portion of the integrated circuit packaging system.

Referring now to FIG. 14, therein is shown a bottom isometric view of a portion of the integrated circuit packaging system 1100. The bottom isometric view depicts the base package 1104 having stack devices 1402, which are defined as semiconductor components.

As an example, the stack devices 1402 can represent semiconductor components including passive devices or active devices. As a specific example, the stack devices 1402 can represent decoupling capacitor used to decouple one part of an electrical network from another of the electrical network so that noise caused by a circuit element can be shunted through the bypass capacitors.

The stack devices 1402 can be mounted over the interposer bottom side 202. The stack devices 1402 can be adjacent or along the interposer peripheral sides 502. The stack devices 1402 can be attached to the interposer bottom side 202. The stack devices 1402 can be under the stack package 1102 of FIG. 11 attached to the interposer top side 204 of FIG. 2.

The stack devices 1402 can be electrically connected to the interposer fingers 802, the interposer pads 804, the interposer traces 806, or a combination thereof. One of the stack devices 1402 can be electrically connected to one of the interposer traces 806 and another of the interposer traces 806.

It has been discovered that the stack devices 1402 attached to the interposer bottom side 202 in the base package 1104 provides reduced area on the system board over which the base package 1104 is mounted because addition of the stack devices 1402 does not need additional spacing on the system board.

It has also been discovered that one of the stack devices 1402 electrically connected to one of the interposer traces 806 and another of the interposer traces 806 provides improved reliability. The stack devices 1402 functioning as decoupling capacitors eliminate undesired noise from power supplies thereby providing improved reliability.

Figure 15:
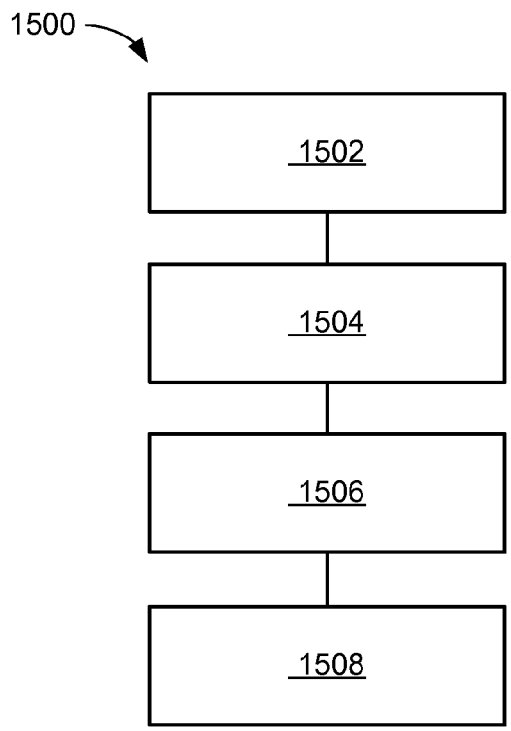
FIG. 15 is a flow chart of a method of manufacture of the integrated circuit packaging system in a further embodiment of the present invention.

Referring now to FIG. 15, therein is shown a flow chart of a method 1500 of manufacture of the integrated circuit packaging system 100 in a further embodiment of the present invention. The method 1500 includes: providing an interposer having an interposer bottom side and an interposer top side in a block 1502; attaching a base integrated circuit to the interposer bottom side in a block 1504; attaching a lead to the interposer bottom side, the lead adjacent the base integrated circuit and entirely below the interposer in a block 1506; and forming an encapsulation partially covering the lead and exposing the interposer top side in a block 1508.

Thus, it has been discovered that the integrated circuit packaging system of the present invention furnishes important and heretofore unknown and unavailable solutions, capabilities, and functional aspects for an integrated circuit packaging system with interposer. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing an interposer having interposer fingers, interposer pads, interposer peripheral sides, an interposer bottom side, and an interposer top side, wherein the interposer fingers and the interposer pads are formed as single integral structures, the interposer fingers are adjacent and along only one of the interposer peripheral sides, and the interposer pads are adjacent the interposer peripheral sides;
attaching a base integrated circuit to the interposer bottom side;
mounting a stack integrated circuit over the base integrated circuit, the stack integrated circuit overhangs the base integrated circuit;
attaching an internal electrical connector directly to the stack integrated circuit and the base integrated circuit;
attaching a lead to the interposer bottom side, the lead adjacent the base integrated circuit and entirely below the interposer; and
forming an encapsulation partially covering the lead and exposing the interposer top side; and
wherein:
attaching the lead includes attaching the lead having a lead outer portion below the encapsulation.

2. The method as claimed in claim 1 wherein:
providing the interposer includes providing the interposer having the interposer pads along another of the interposer peripheral sides, wherein the interposer peripheral sides are connected to each other; and
attaching the internal electrical connector includes attaching the internal electrical connector to one of the interposer fingers and the base integrated circuit.

3. The method as claimed in claim 1 wherein:
providing the interposer includes providing the interposer having the interposer pads at the interposer bottom side; and
attaching the lead includes attaching the lead to one of the interposer pads.

4. The method as claimed in claim 1 wherein:
attaching the lead includes attaching the leads to the interposer along only two of the interposer peripheral sides.

5. The method as claimed in claim 1 further comprising attaching a stack device to the interposer bottom side.

6. A method of manufacture of an integrated circuit packaging system comprising:
providing an interposer having interposer fingers, interposer pads, interposer peripheral sides, an interposer bottom side, and an interposer top side, wherein the interposer fingers and the interposer pads are formed as single integral structures, the interposer fingers are adjacent and along only one of the interposer peripheral sides, and the interposer pads are adjacent two of the interposer peripheral sides;
attaching a base integrated circuit to the interposer bottom side;
mounting a stack integrated circuit over the base integrated circuit, the stack integrated circuit overhangs the base integrated circuit;
attaching an internal electrical connector directly to the stack integrated circuit and the base integrated circuit;
attaching a lead to the interposer bottom side, the lead adjacent the base integrated circuit and entirely below the interposer; and
forming an encapsulation partially covering the lead, the encapsulation exposing and coplanar with the interposer top side; and
wherein:
attaching lead includes attaching the lead having a lead outer portion below the encapsulation.

7. The method as claimed in claim 6 wherein:
mounting the base integrated circuit includes mounting the base integrated circuit over the interposer, the base integrated circuit having a base peripheral side and a base pad along only the base peripheral side; and
attaching the internal electrical connector includes attaching the internal electrical connector to one of the interposer fingers and the base pad.

8. The method as claimed in claim 6 wherein:
providing the interposer includes providing the interposer having the interposer pads at the interposer bottom side, the interposer pads along only two of the interposer peripheral sides; and
attaching the lead includes attaching the lead to one of the interposer pads.

9. The method as claimed in claim 6 wherein:
attaching the lead includes attaching the leads to the interposer along only two of the interposer peripheral sides, each of the leads having a lead inner portion and a lead outer portion below the lead inner portion, the lead inner portion attached to the interposer bottom side.

10. The method as claimed in claim 6 further comprising:
attaching a stack device to the interposer bottom side; and
attaching a stack package to the interposer top side, the stack package over the stack device.

11. An integrated circuit packaging system comprising:
an interposer having interposer fingers, interposer pads, interposer peripheral sides, an interposer bottom side, and an interposer top side, wherein the interposer fingers and the interposer pads are formed as single integral structures, the interposer fingers are adjacent and along only one of the interposer peripheral sides, and the interposer pads are adjacent two of the interposer peripheral sides;
a base integrated circuit attached to the interposer bottom side;
a stack integrated circuit over the base integrated circuit, the stack into integrated circuit overhangs the base integrated circuit;
an internal electrical connector attached directly to the stack integrated circuit and the base integrated circuit;
a lead attached to the interposer bottom side, adjacent the base integrated circuit, and entirely below the interposer; and
an encapsulation partially covering the lead and exposing the interposer top side; and
wherein:
the lead includes a lead outer ion below the encapsulation.

12. The system as claimed in claim 11 wherein:
the interposer includes the interposer pads along another of the interposer peripheral sides, wherein the interposer peripheral sides are connected to each other; and
the internal electrical connector includes the internal electrical connector attached to one of the interposer fingers and the base integrated circuit.

13. The system as claimed in claim 11 wherein:
the interposer includes the interposer pads at the interposer bottom side; and
the lead is attached to one of the interposer pads.

14. The system as claimed in claim 11 wherein:
the lead includes leads attached to the interposer along only two of the interposer peripheral sides.

15. The system as claimed in claim 11 further comprising a stack device attached to the interposer bottom side.

16. The system as claimed in claim 11 wherein the encapsulation is coplanar with the interposer top side.

17. The system as claimed in claim 16 wherein:
the base integrated circuit over the interposer, the base integrated circuit having a base peripheral side and a base pad along only the base peripheral side; and
the internal electrical connector includes the internal electrical connector attached to one of the interposer fingers and the base pad.

18. The system as claimed in claim 16 wherein:
the interposer includes the interposer pads at the interposer bottom side, the interposer pads along only two of the interposer peripheral sides; and
the lead is attached to one of the interposer pads.

19. The system as claimed in claim 16 wherein:
the lead includes leads attached to the interposer along only two of the interposer peripheral sides, each of the leads having a lead inner portion and a lead outer portion below the lead inner portion, the lead inner portion attached to the interposer bottom side.

20. The system as claimed in claim 16 further comprising:
a stack device attached to the interposer bottom side; and
a stack package attached to the interposer top side, the stack package over the stack device.

\* \* \* \* \*